United States Patent [19]
Kim et al.

[11] Patent Number: 5,719,086
[45] Date of Patent: Feb. 17, 1998

[54] METHOD FOR ISOLATING ELEMENTS OF SEMICONDUCTOR DEVICE

[75] Inventors: Young Bog Kim; Sung Ku Kwon; Byung Jin Cho; Jong Choul Kim, all of Bubaleub, Rep. of Korea

[73] Assignee: Hyundai Electronics Industries Co., Ltd., Rep. of Korea

[21] Appl. No.: 742,885

[22] Filed: Nov. 1, 1996

[30] Foreign Application Priority Data

Nov. 3, 1995 [KR] Rep. of Korea .................. 1995-39693

[51] Int. Cl.[6] ...................................... H01L 21/76
[52] U.S. Cl. .................. 438/443; 438/445; 438/452; 438/775
[58] Field of Search .................. 438/443, 445, 438/452, 775, 232

[56] References Cited

U.S. PATENT DOCUMENTS 5,087,586  2/1992  Chan et al. .
5,256,895  10/1993  Bryant et al. ............... 257/501
5,298,451  3/1994  Rao .
5,399,520  3/1995  Jang .

FOREIGN PATENT DOCUMENTS 59-75667  4/1984  Japan .

*Primary Examiner*—George R. Fourson
*Attorney, Agent, or Firm*—Blakely Sokoloff Taylor & Zafman

[57] ABSTRACT

A method for isolating the elements of semiconductor devices, in which bird's beak can be restrained by accumulating nitrogen atoms between a pad oxide film and a silicon substrate and the etch depth of a silicon substrate can be controlled by use of wet etch to remove the oxide which is grown on the silicon substrate at a low temperature after formation of nitride spacer, thereby reproducing good profiles of the field oxide film.

11 Claims, 5 Drawing Sheets

METHOD FOR ISOLATING ELEMENTS OF SEMICONDUCTOR DEVICE

BACKGROUND OF THE INVENTION

1. Field of the Invention

The present invention relates, in general, to a method for isolating the elements of semiconductor devices and, more particularly, to the restraint of bird's beak upon LOCOS process and to the control of the etch depth upon recessed LOCOS process, along with the method for providing such restraint and control.

2. Description of the Prior Art

Most of the element isolation methods in current use are dependent on LOCOS process. Particularly, recessed LOCOS processes are widely used to obtain good profiles of field oxide films.

A conventional recessed LOCOS process will be, in detail, described in connection with FIGS. 1A through 1D.

First, referring to FIG. 1A, there is a cross section after a pad oxide film 12 is formed on a silicon substrate 11, followed by the formation of a thick nitride film over the pad oxide film 12.

Then, the nitride film 13 and the pad oxide film 12 are, in sequence, opened at a predetermined region by a selective etching process with a mask, for example, a photoresist pattern (not shown), to make a field region 14 through which a predetermined region of the silicon substrate 11 is exposed.

Next, a thin nitride oxide film is deposited entirely over the resulting structure and then subjected to whole surface dry etch to form a nitride spacer 15 at the side wall which is conferred by the patterned nitride film 13 and pad oxide film 12, as shown in FIG. 1C. Thereafter, the exposed field region 14 of the silicon substrate 11 is dry etched to a predetermined depth, for example, about 300 to 800 Å. This is indicated by reference numeral 16.

FIG. 1D is a cross section after a field oxide film 17 is formed by oxidation at high temperature, followed by the removal of all films, except for the field oxide film, stacked on the silicon substrate 11. In FIG. 1D, reference numeral 18 represents a bird's beak.

Although a nitride spacer was used in such a conventional method, it is insufficient to prevent the bird's beak produced along the pad oxide film. Further, when dry etching the silicon substrate according to the conventional method, it is difficult to control the etch depth, particularly, of less than 500 Å. Possible as it is, reproductivity is very poor. The dry etch effects great damage. With the conventional method, it is found that large variations are made to the profile of the field oxide film and the bird's beak. Furthermore, the thick nitride spacer used to secure an active region causes a problem in making the field oxide film thin.

SUMMARY OF THE INVENTION

Therefore, it is an objective to the present invention to overcome the above problems encountered in prior arts and to provide a method for isolating elements of semiconductor devices, which are capable of restraining the generation of the bird's beak in such a considerable degree as to secure a large active region, controlling the etch depth of a semiconductor substrate, reproducing good profiles of the field oxide film.

In accordance with the present invention, the above objective could be accomplished by a provision of a method for isolating the elements of semiconductor devices, comprising the steps of: forming a stress buffer layer on a semiconductor substrate; annealing in a gas atmosphere containing nitrogen to form a nitrogen-accumulated layer at the interface between the semiconductor substrate and the buffer layer; depositing an oxidation-preventing layer entirely over the resulting structure; selectively etching the oxidation-preventing layer and the buffer layer at a field region to give a first recessed region; forming a spacer for restraining a bird's beak at the side wall of the first recessed region; forming a sacrificial oxide film in a first oxidation process; removing the sacrificial oxide film in a wet etching process to form a second recessed region in the semiconductor substrate; and forming a field oxide film in a second oxidation process.

As will be described in more detail, according to the present invention, the bird's beak can be restrained by accumulating nitrogen atoms between the pad oxide film and the silicon substrate and the etch depth of the silicon substrate can be controlled by use of wet etch to remove the oxide which is grown on the silicon substrate at a low temperature after formation of nitride spacer, thereby reproducing good profiles of the field oxide film.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENT

Figure 1A:
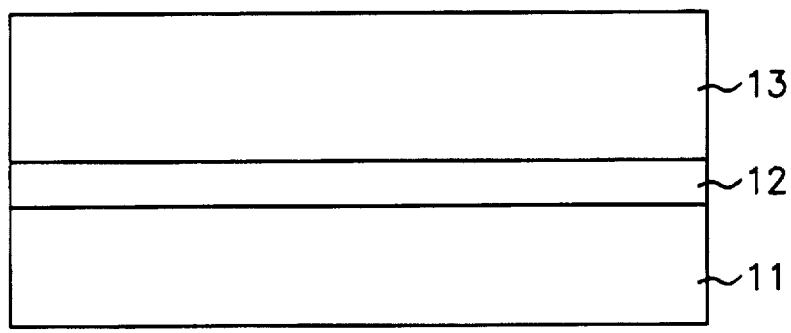
FIGS. 1A through 1D are schematic cross sectional views illustrating conventional recessed LOCOS processes.
Figure 1B:
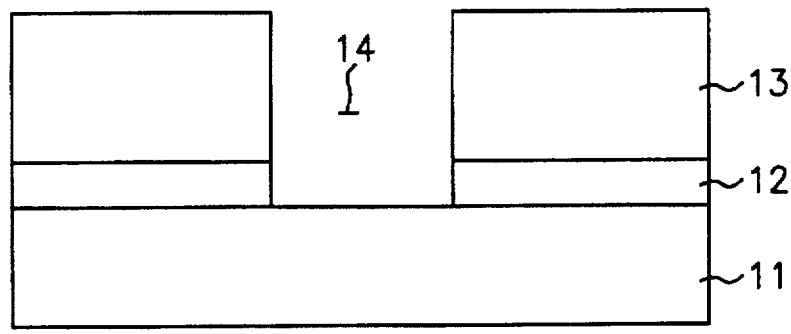
Figure 1C:
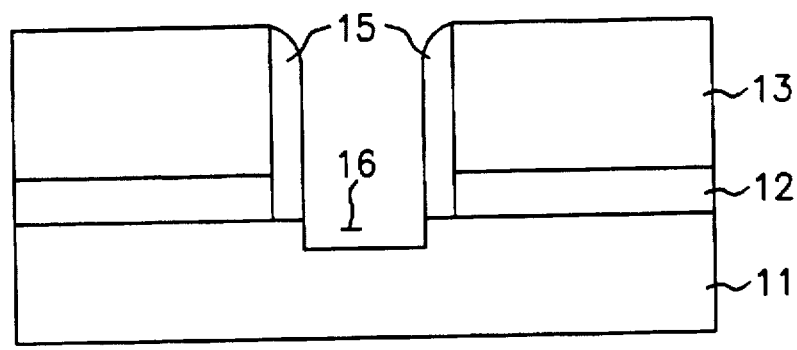
Figure 1D:
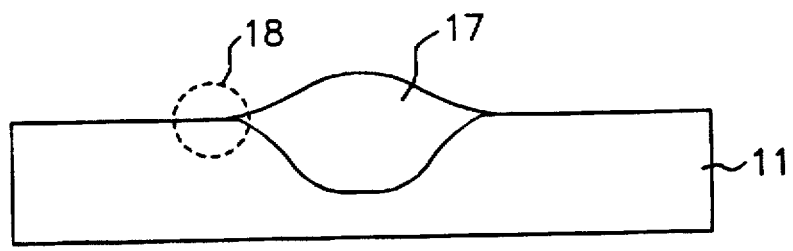

The application of the preferred embodiments of the present invention is best understood with reference to the accompanying drawings, wherein like reference numerals are used for like and corresponding parts, respectively.

Referring to FIGS. 2A through 2F, there is illustrated a method for isolating the elements of semiconductor devices, according to the present invention.

Figure 2A:
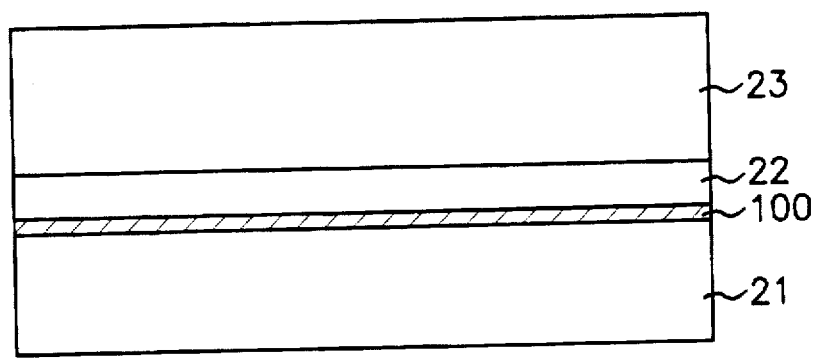
FIGS. 2A through 2F are schematic cross sectional views illustrating a method for isolating the elements of semiconductor devices, according to the present invention.

First, as shown in FIG. 2A, a pad oxide film 22 is formed at a thickness of about 50 to 200 Å on a silicon substrate 21 which is, then, annealed at 800° to 1,000° C. and at 10 to 100 torr for about 0.5 to 2 hours in an $NH_3$ gas atmosphere to form an oxynitride layer 100 in which nitrogen atoms are accumulated, at the interface between the silicon substrate 21 and the pad oxide film 22. Following this, an oxidation-preventing nitride film 23 is deposited at a thickness of about 1,000 to 3,000 Å.

Figure 2B:
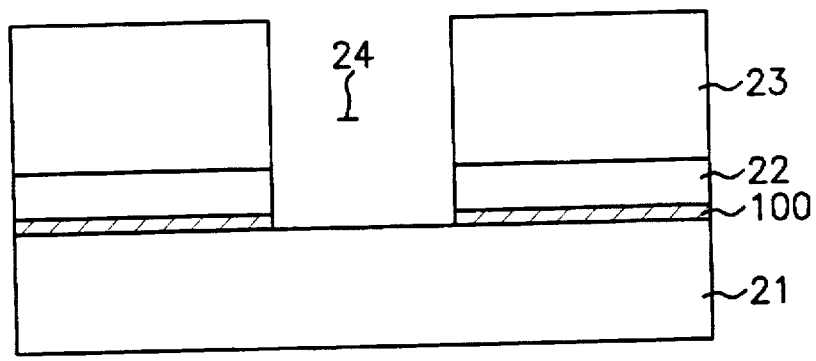

Next, the nitride film 23 and the pad oxide film 22 are, in sequence, opened at a predetermined region by an etching process using a mask to make a field region. At this moment, the oxynitride layer 100 is also selectively etched, as shown in FIG. 2B.

Figure 2C:
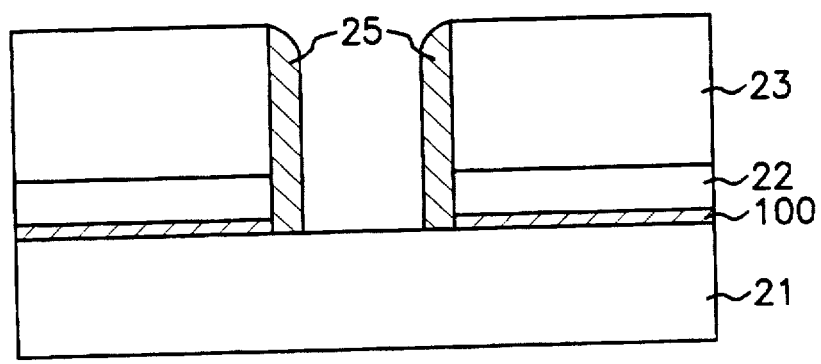

FIG. 2C is a cross section after a space nitride film 25 is formed at the side wall which is conferred by the nitride film 23, the pad oxide film 22 and the oxynitride film 100 are opened. For this, a nitride film is deposited in a thin layer, for example, 100–700 Å along the entire surface of the resulting structure and then, subjected to etch to form the space nitride film 25.

Figure 2D:
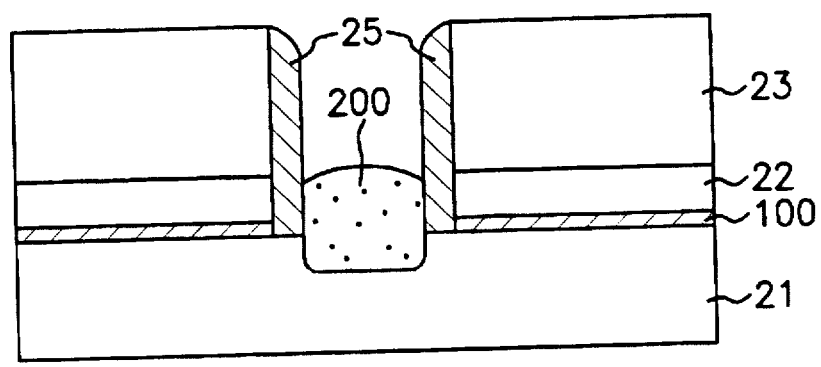

Subsequently, an oxide 200 is grown to a thickness of 1,000 Å on the silicon substrate 21 of the field region 24, as shown in FIG. 2D. This oxidation is carried out at a relatively low temperature, for example, about 700° to 900° C. It should be noted that the oxide 200 is not a field oxide but a kind of sacrificial layer for etching the silicon substrate 21. A reason why the silicon substrate is oxidized at such low temperatures is that the stress generated between the spacer nitride film 25 and the silicon substrate 21 upon oxidation becomes large, virtually eliminating the generation of the bird's beak. Also, because the oxide 200 grown has a vertical side wall, an anisotropic silicon recess profile can be obtained when the oxide 200 is removed.

Figure 2E:
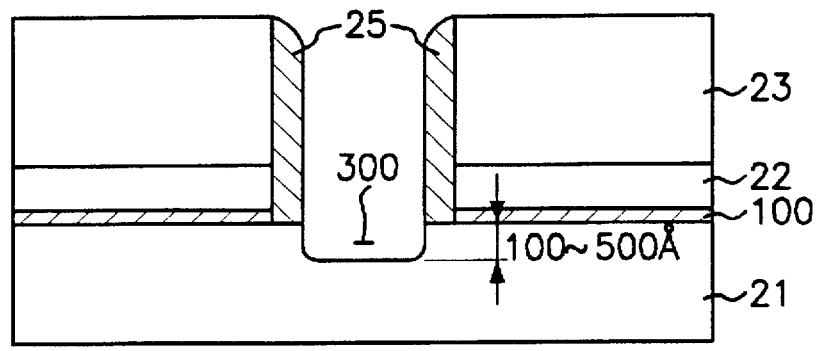
Figure 2F:
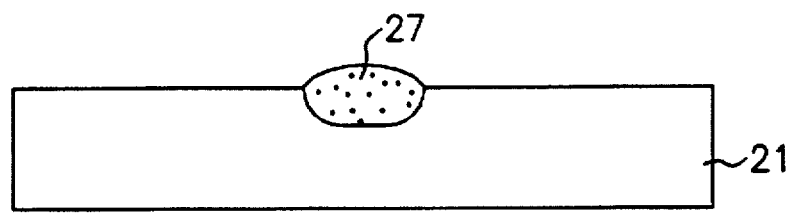

FIG. 2E is a cross section after the thin oxide 200 in the field region is removed by use of HF solution to form a recessed region 300. At this time, the depth to which the silicon substrate 21 is etched ranges from about 100 to 500 Å. It must be kept in mind that the depth is determined by the growth of the oxide 200 in the previous process. The oxide 200 may remain at a little amount, that is, its being etched can be controlled in a range of about 80 to 100%.

Finally, a field oxide film 27 is formed in a thickness of about 2,000 to 5,000 Å at a high temperature of about 1,000° to 1,200° C. and all the other films formed on the silicon substrate 21 are removed.

As apparent from the above description, when oxidizing the silicon substrate to form the oxide film, the stress of the spacer nitride film becomes increased, which makes slow the progress of the diffusion of oxygen into the pad, in accordance with the present invention. To some degree as oxygen is diffused into the pad oxide, the nitrogen atoms accumulated in the interface between the silicon substrate and the pad oxide film are preventive of further diffusion of the oxygen, lessening the bird's beak.

In addition, the use of sacrificial oxide film gives a virtually vertical profile to the silicon substrate as well as allows the recess depth to be properly controlled. Thus, good profiles of the field oxide film can be reproduced. Moreover, because the sacrificial oxide film is removed in a wet manner, the defects attributable to the etch damage as in the wet etch do not occur in the present invention.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for isolating the elements of semiconductor devices, comprising the steps of:
   forming a stress buffer layer on a semiconductor substrate;
   annealing in a gas atmosphere containing nitrogen to form a nitrogen-accumulated layer at the interface between the semiconductor substrate and the buffer layer;
   depositing an oxidation-preventing layer entirely over the resulting structure;
   selectively etching the oxidation-preventing layer and the buffer layer at a field region to give a first recessed region;
   forming a spacer for restraining a bird's beak at the side wall of the first recessed region;
   forming a sacrificial oxide film in a first oxidation process;
   removing the sacrificial oxide film in a wet etching process to form a second recessed region in the semiconductor substrate; and
   forming a field oxide film in a second oxidation process.

2. A method in accordance with claim 1, wherein said annealing step is carried out in an $NH_3$ gas atmosphere.

3. A method in accordance with claim 2, wherein said annealing step is carried out at about 800° to 1,000° C. and at a pressure of 10 to 100 torr for 0.5 to 2 hours.

4. A method in accordance with claim 1, wherein said selectively etching step is carried out until the nitrogen-accumulated layer is etched.

5. A method in accordance with claim 1, wherein said spacer is formed in the direction of said side wall, with its thickness ranging from 100 to 700 Å.

6. A method in accordance with claim 1, wherein said second recessed region has a depth of 100 to 500 Å.

7. A method in accordance with claim 1, wherein said first oxidation process is carried out at a temperature of 700° to 900° C.

8. A method in accordance with claim 7, wherein said sacrificial oxide film is formed at a thickness of 100 to 1,000 Å.

9. A method in accordance with claim 1, wherein said sacrificial oxide film is removed at a range of 80 to 100% of its total thickness.

10. A method in accordance with claim 1, wherein said oxidation-restraining layer and the spacer each comprise a nitride film.

11. A method in accordance with claim 10, wherein said buffer layer comprises an oxide film.

* * * * *